(12) United States Patent
Paillet et al.

(10) Patent No.: US 7,321,502 B2
(45) Date of Patent: Jan. 22, 2008

(54) NON VOLATILE DATA STORAGE THROUGH DIELECTRIC BREAKDOWN

(75) Inventors: Fabrice Paillet, Hillsboro, OR (US); Ali Keshavarzi, Portland, OR (US); Muhammad M. Khellah, Tigard, OR (US); Dinesh Somasekhar, Portland, OR (US); Yibin Ye, Portland, OR (US); Stephen H. Tang, Pleasanton, CA (US); Alavi Mohsen, Portland, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 361 days.

(21) Appl. No.: 10/956,285

(22) Filed: Sep. 30, 2004

(65) Prior Publication Data

US 2006/0071646 A1   Apr. 6, 2006

(51) Int. Cl.
*G11C 17/00* (2006.01)

(52) U.S. Cl. .................. 365/102; 365/94; 365/149; 365/189.09

(58) Field of Classification Search ............. 365/94 X, 365/102 O, 103, 104, 149 X, 189.01, 189.09 X, 365/189.11, 207, 94, 102, 149, 189.09
See application file for complete search history.

(56) References Cited

U.S. PATENT DOCUMENTS

| | | |
|---|---|---|
| 5,291,434 A | 3/1994 | Kowalski |
| 5,742,555 A | 4/1998 | Marr et al. |
| 5,789,796 A | 8/1998 | Kang et al. |
| 5,798,552 A | 8/1998 | Alavi et al. |
| 5,909,049 A | 6/1999 | McCollum |
| 5,949,250 A | 9/1999 | Schmidt et al. |
| 6,172,401 B1 | 1/2001 | Brand |
| 6,181,608 B1 | 1/2001 | Keshavarzi et al. |
| 6,201,428 B1 | 3/2001 | Clark |
| 6,240,033 B1 | 5/2001 | Yang et al. |
| 6,243,294 B1 | 6/2001 | Rao et al. |
| 6,407,591 B1 | 6/2002 | Wong et al. |
| 6,417,720 B1 | 7/2002 | Denham |
| 6,515,344 B1 | 2/2003 | Wollesen |
| 6,519,176 B1 | 2/2003 | Hamzaoglu et al. |
| 6,580,145 B2 | 6/2003 | Wu et al. |
| 6,584,029 B2 | 6/2003 | Tran et al. |
| 6,599,796 B2 | 7/2003 | Mei et al. |
| 6,686,791 B2 | 2/2004 | Zheng et al. |
| 6,693,481 B1 | 2/2004 | Zheng et al. |
| 6,710,640 B1 | 3/2004 | Kothandaraman et al. |
| 6,788,607 B2 | 9/2004 | Duval et al. |

(Continued)

OTHER PUBLICATIONS

J. Kim and K. Lee, "Transistor Antifuse OTP ROM Array Using Standard CMOS Process", 2003 Synposium on VLSI Circuits Digest of Technical Papers, pp. 239-242.

*Primary Examiner*—VanThu Nguyen
(74) *Attorney, Agent, or Firm*—Blakely, Sokoloff, Taylor & Zafman LLP

(57) ABSTRACT

A method is described that induced dielectric breakdown within a capacitor's dielectric material while driving a current through the capacitor. The current is specific to data that is being written into the capacitor. The method also involves reading the data by interpreting behavior of the capacitor that is determined by the capacitor's resistance, where, the capacitor's resistance is a consequence of the inducing and the driving.

18 Claims, 7 Drawing Sheets

U.S. PATENT DOCUMENTS

| | | |
|---|---|---|
| 6,822,888 B2 | 11/2004 | Peng |
| 7,102,951 B2 | 11/2004 | Paillet et al. |
| 6,836,000 B1 | 12/2004 | Marr et al. |
| 7,002,842 B2 | 2/2006 | Tang et al. |
| 7,030,458 B2 | 4/2006 | Marr |
| 7,031,203 B2 | 4/2006 | Tang et al. |
| 7,042,772 B2 * | 5/2006 | Wang et al. ........... 365/189.09 |
| 7,110,278 B2 | 9/2006 | Keshavarzi et al. |
| 2005/0169055 A1 | 8/2005 | Lung |
| 2006/0139995 A1 | 6/2006 | Keshavarzi et al. |

* cited by examiner

NON VOLATILE DATA STORAGE THROUGH DIELECTRIC BREAKDOWN

FIELD OF INVENTION

The field of invention relates generally to the electronic arts; and, more specifically, to non volatile data storage through dielectric breakdown.

BACKGROUND

Field Effect Transistors (FETs) have traditionally been built with a gate node, a source node and a drain node. Metal Oxide Semiconductor FETs (MOSFETs) are presently the most commonly manufactured type of transistor. FIG. 1 shows a gate node 101 for a MOSFET. The gate node 101 is comprised of a metal and/or (more commonly) a heavily doped polycrystalline silicon layer which behaves like a metal. The gate node 101 is separated from an underlying conductive semiconductor region 103 by an oxide layer 102. The gate node 101, oxide 102 and conductive semiconductor region 103 essentially form a capacitor structure.

The electric field strength within the oxide layer 102 is proportional to the voltage between the gate node 101 and the underlying semiconductor wafer; and, the electronic field strength within the gate oxide layer is inversely proportional to the thickness of the oxide 102. Thus, the higher the gate node 101 voltage and the thinner the oxide layer 102, the greater the electric field strength. If "too strong" an electric field is established within the oxide layer 102, the oxide layer 102 will suffer "dielectric breakdown".

Dielectric breakdown is a form of oxide layer 102 damage. An oxide layer 102, being a dielectric layer 102, is an electrical insulator rather than an electrical conductor. As such, only an infinitesimal DC current $I_{OX}$ (e.g., a few nanoamps (nA) or picoamps (pA)) will flow through oxide layer 102 if a voltage below a critical voltage at which dielectric breakdown occurs is applied to the gate node 101 and the oxide layer 102 has not already suffered dielectric breakdown. Because of the infinitesimal current, the DC resistance $R_{OX}$ of the oxide layer 102 is said to be "near-infinite" (e.g., tens or hundreds of Megohms (MΩ)).

If the oxide layer 102 experiences dielectric breakdown, however, the behavior of the oxide layer 102 thereafter changes from that of an insulator to that of a semiconductor. Essentially, the DC resistance $R_{OX}$ of the oxide layer 102 drops from its pre-breakdown value to a smaller value so as to allow a more substantial current such as tenths of microamps (µA) or higher.

Traditionally, the largest voltage that could reasonably be applied to a semiconductor chip's transistors has been well beneath the critical voltage at or above which dielectric breakdown could occur. With the continued miniaturization of transistor sizes and corresponding reduction in oxide thickness, however, it is presently more feasible to apply a gate voltage above a critical threshold value at or above which dielectric breakdown will occur.

FIGURES

The present invention is illustrated by way of example, and not limitation, in the figures of the accompanying drawings in which like references indicate similar elements and in which.

DETAILED DESCRIPTION

It has been realized that information can be stored in dielectric material that has been subjected to dielectric breakdown. In particular, it has been realized that post breakdown DC resistance is a function of the conditions of the dielectric breakdown itself; and that, as a consequence, different data can be effectively stored in a dielectric layer by controlling the breakdown conditions it is subjected to.

Figure 1:
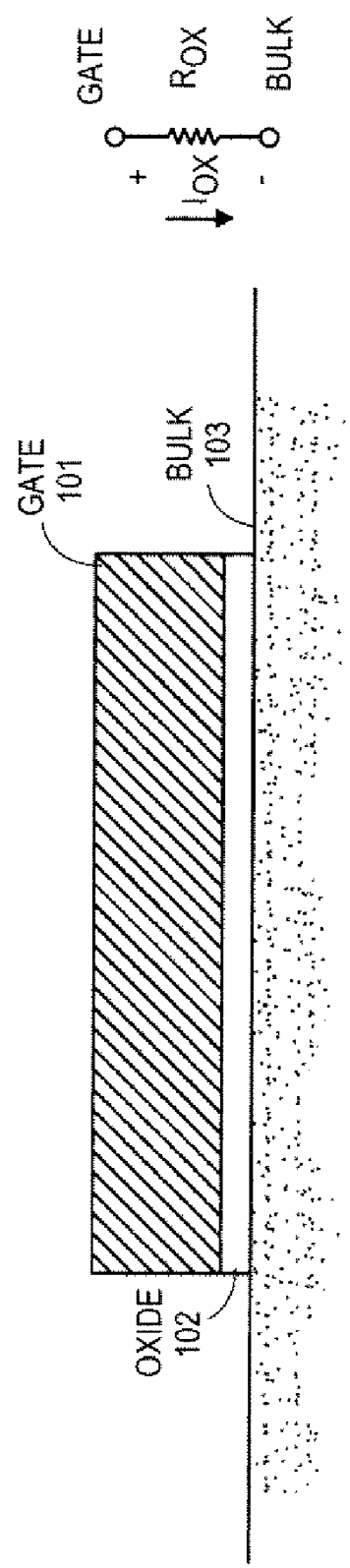
FIG. 1 shows a transistor gate structure.
Figure 2A:
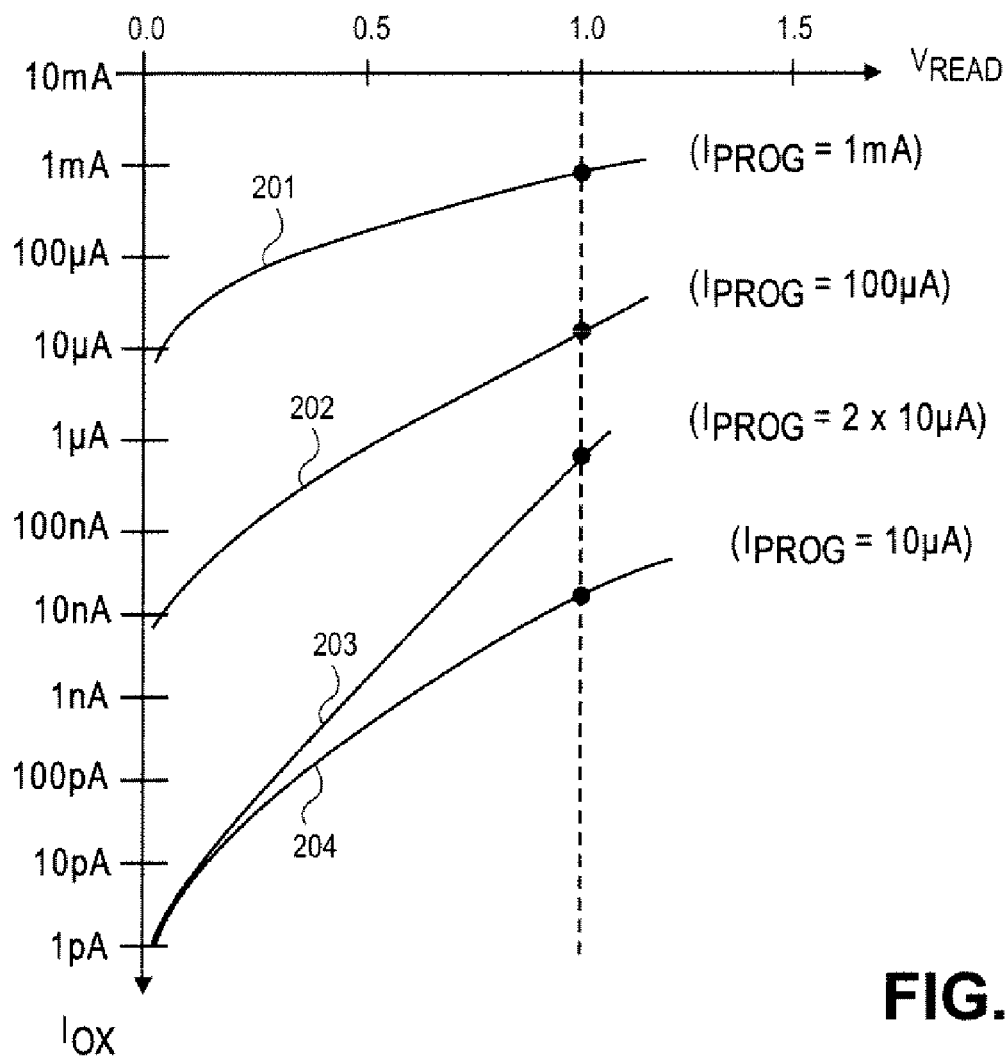
FIG. 2a shows oxide current vs. applied gate voltage for oxides that have undergone different dielectric breakdown conditions.
Figure 2B:
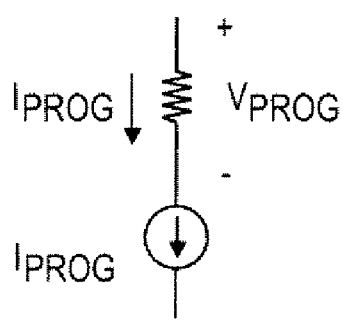
FIG. 2b shows a circuit model for writing data into a gate dielectric.
Figure 2C:
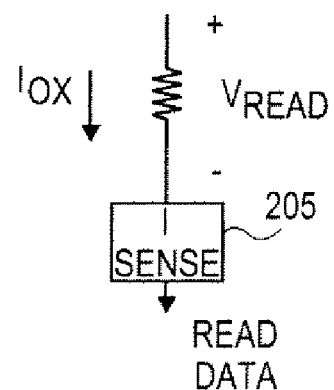
FIG. 2c shows a circuit model for reading data from the gate dielectric.

FIGS. 2a through 2c explore the technique in more detail. FIG. 2a shows oxide current vs. applied "post breakdown" gate voltage for gate oxides with identical material and structural composition that have undergone different dielectric breakdown conditions. FIG. 2b shows an equivalent circuit for the dielectric breakdown condition. According to FIG. 2b, a voltage sufficiently high to cause dielectric breakdown ($V_{PROG}$) is applied to the gate node while a DC current ($I_{PROG}$) is forcibly driven through the dielectric.

Curve 201 of FIG. 2a shows a DC resistance curve for a gate oxide that was subjected to an $I_{PROG}$ of 1 mA during dielectric breakdown. Referring briefly to FIG. 2c, which shows an equivalent circuit for reading stored information from a dielectric after it has been subjected to breakdown, a DC resistance curve is simply a plot of the DC current ($I_{OX}$) through the dielectric, after it has been subjected to dielectric breakdown, that results when a DC voltage ($V_{READ}$) is applied across the dielectric. The read voltage $V_{READ}$ should be sufficiently less than $V_{PROG}$ so that the stored data is not changed through additional accidental breakdown caused by the application of the read voltage.

Curve 202 of FIG. 2a shows a DC resistance curve for a gate oxide that was subjected to an $I_{PROG}$ of 100 µA during dielectric breakdown. Curve 203 of FIG. 2a shows a DC resistance curve for a gate oxide that was twice subjected to an $I_{PROG}$ of 10 µA during dielectric breakdown for approximately 100 ms. Curve 204 of FIG. 2a shows a DC resistance curve for a gate oxide that was subjected to an $I_{PROG}$ of 10 µA only once during dielectric breakdown.

The same structure was used for each of the four gates structure (one distinct gate structure for each curve) used to generate the data of FIG. 2a. Each structure had a gate dielectric thickness of 20 Å and a gate length of 80 nm. The applied gate voltage $V_{PROG}$ for inducing breakdown was 3.0 V for each of the four gates as well.

Because of the different breakdown conditions (i.e., the different applications of $I_{PROG}$ during breakdown), the DC resistance curves 201, 202, 203, 204 of FIG. 2a are different as well. In general, higher or more extensive $I_{PROG}$ during breakdown results in lower observed DC resistance after breakdown. In a sense, stronger $I_{PROG}$ during breakdown results in more damage to the dielectric; which, after breakdown, corresponds to less resistance/more current when the read voltage $V_{READ}$ is applied across the dielectric.

As such, the structure submitted to the more extensive $I_{PROG}$ during breakdown exhibits the lowest DC resistance (highest DC current) 201. The structure submitted to the second most extensive $I_{PROG}$ during breakdown exhibits the second lowest DC resistance (second highest DC current) 202. The structure submitted to the third most extensive $I_{PROG}$ during breakdown exhibits the third lowest DC resistance (third highest DC current) 203. The structure submitted to the fourth most extensive $I_{PROG}$ during breakdown exhibits the highest DC resistance (lowest DC current) 204.

These properties can be used as a basis for storing data. For example, note that an applied read voltage $V_{READ}$ of 1.0 v after breakdown results in an observed DC current $I_{OX}$ of approximately 1 mA for curve 201; 10 µA for curve 202; 1 µA for curve 203; and 10 nA for curve 204. Here, different $I_{OX}$ currents can be made to correspond to different data. For example, referring to FIG. 2c, the observed current sense circuitry 205 could be designed to interpret, for an applied read voltage $V_{READ}$ of 1.0 v: 1) "00" for a sensed $I_{OX}$ of approximately 1 ma (curve 201); 2) "01" for a sensed $I_{OX}$ of approximately 10 µA (curve 202); 3) "10" for a sensed $I_{OX}$ of approximately 1 µA (curve 203); 4) "11" for a sensed $I_{OX}$ of approximately 10 nA (curve 204). Of course, if more than four distinctly different breakdown conditions were imposed, more than four different data combinations could be stored by the dielectric (e.g., 8, 16, etc.).

In order to have initially written the data that the current sense circuitry 205 interprets, all that would need to be have been done is to apply the appropriate breakdown condition. That is: 1) $I_{PROG}$=1 ma for "00"; 2) $I_{PROG}$=100 µA for "01"; 3) $I_{PROG}$=2×10 µA for "10"; and, 4) $I_{PROG}$=1×10 µA for "11". Because dielectric breakdown is a form of "permanent damage" a non volatile, "write once read many times" memory cell technology can therefore be implemented.

Figure 3:
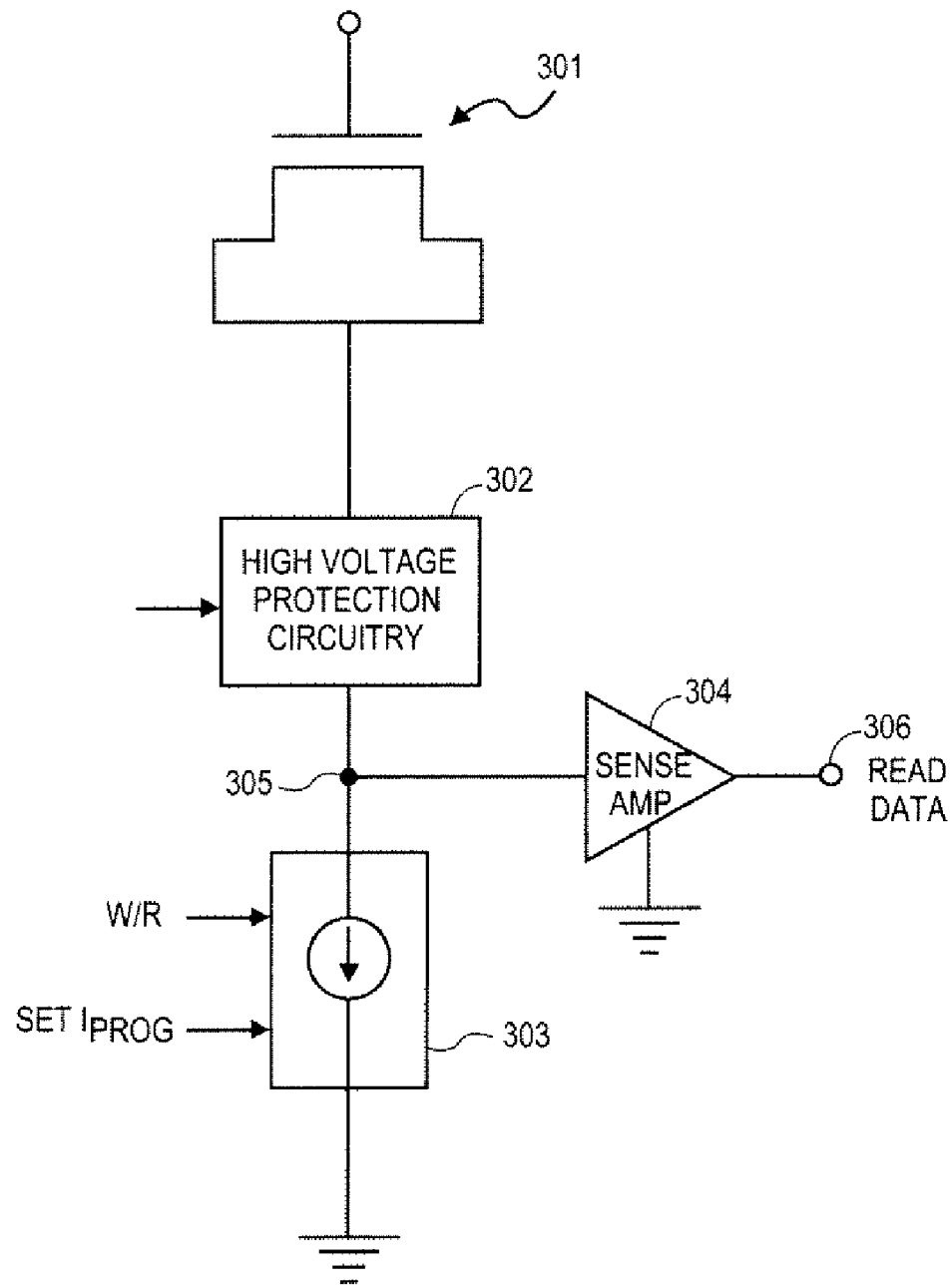
FIG. 3 shows storage cell that is capable of storing data with a gate dielectric that has experienced dielectric breakdown.

FIG. 3 shows an embodiment of a circuit designed to implement a non volatile, "write once read many times" memory cell through dielectric breakdown. Circuitry 303 is a current source that pulls the appropriate $I_{PROG}$ current through a capacitor structure 301 having a dielectric that is subjected to a "write" programming voltage $V_{PROG}$ sufficient to cause breakdown of the dielectric. Here, the capacitor structure can be formed with an FET transistor (such as a MOSFET) that has its drain and source tied together.

In an embodiment where NMOS type FETs are used, the capacitor structure is as shown in FIG. 3 where the applied voltages are applied directly to the gate node. In an another embodiment where PMOS type FETs are used, the capacitor structure is still formed by tying the source and drain nodes together, however, unlike FIG. 3, the gate node is coupled to the protection circuitry and the voltages that are applied to the capacitor structure are applied directly to the source/drain node.

The "appropriate" $I_{PROG}$ current is a current that sets a particular data value (e.g., as discussed above, 1 mA to implement curve 201 of FIG. 2a for a data value of "00"). The current source circuit 303 can receive a first input command (SET $I_{PROG}$) that identifies the appropriate $I_{PROG}$ current during a write; and, another input command to indicate if the capacitor 301 is deemed in write mode or read mode (R/W). If the capacitor 301 is deemed in write mode, a voltage $V_{PROG}$ sufficient to cause breakdown may be applied to an electrode of the capacitor and the current sense circuit 304 is put into a high impedance state.

Because the $V_{PROG}$ voltage is sufficient to damage other transistors in the integrated circuit that the capacitor structure 301 is integrated within, a high voltage protection circuit 302 is used to prevent the breakdown voltage $V_{PROG}$ from damaging these other transistors. Here, the transistors from which the current source 303 and a current sense circuit 304 (for reading the data from the capacitor 301 after breakdown) are comprised are among those that are protected by the high voltage protection circuitry 302. Thus, at least when the capacitor structure 301 is deemed to be in write mode, the high voltage protection circuitry 302 prevents the damaging high voltage $V_{PROG}$ that is applied to the capacitor 301 during breakdown from reaching current source 303 and current sense circuit 304; while, permitting current source 303 to draw the appropriate $I_{PROG}$ current during an actual write.

During a read, a non damaging read voltage $V_{READ}$ can be applied to the capacitor structure. As such, any protection offered by protection circuit 302 may be immaterial. The current source 303 used to write data during read mode is effectively turned off, placed into a high impedance state or is otherwise made to not interfere with the current sensing activity of current sense circuit 304. When $V_{READ}$ is applied to the capacitor structure 301, the current sensing circuit 304 receives current from the capacitor structure and interprets the amount of current received to particular read data value. The read data is provided at output node 306.

Figure 4:
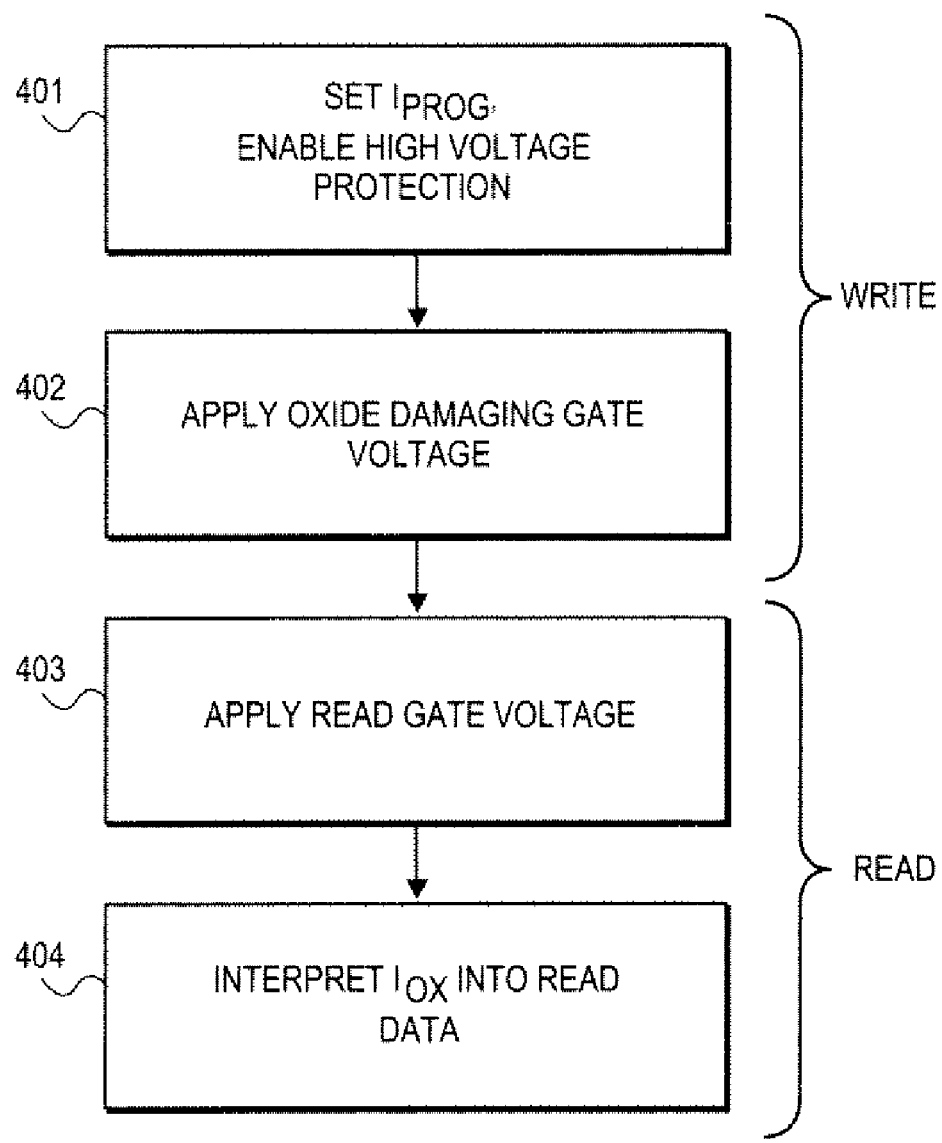
FIG. 4 shows a method for writing to and reading from a storage cell formed with a gate dielectric that has experienced dielectric breakdown.

FIG. 4 shows a methodology suitable for writing and reading data from a capacitor structure through dielectric breakdown. The methodology of FIG. 4 is written with the view that the capacitor structure is a gate for an N type MOSFET transistor having its drain and source tied together. Those of ordinary skill will recognize that the methodology can be easily drawn P type MOSFET transistors and, more generally, to any type of capacitor structure.

According to the methodology of FIG. 4, a write includes setting the $I_{PROG}$ current and enabling the protection of the high voltage protection circuitry 401. Then, a voltage high enough to induce dielectric breakdown $V_{PROG}$ is applied to the gate node 402. For a read, a read voltage $V_{READ}$ is applied to the gate node 403. Then, the current that flows through the gate as a consequence of the applied read voltage is interpreted into specific read data 404.

Figure 5A:
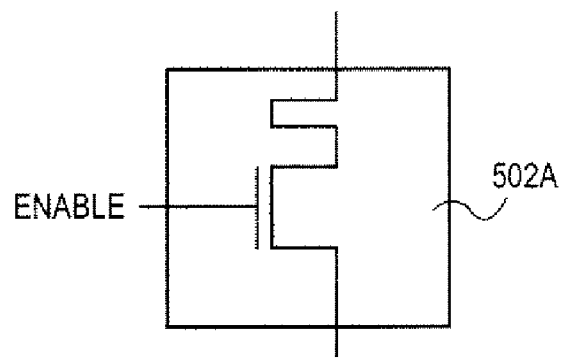
FIG. 5a shows a high voltage protection circuit constructed with an NVDMOS transistor.
Figure 5B:
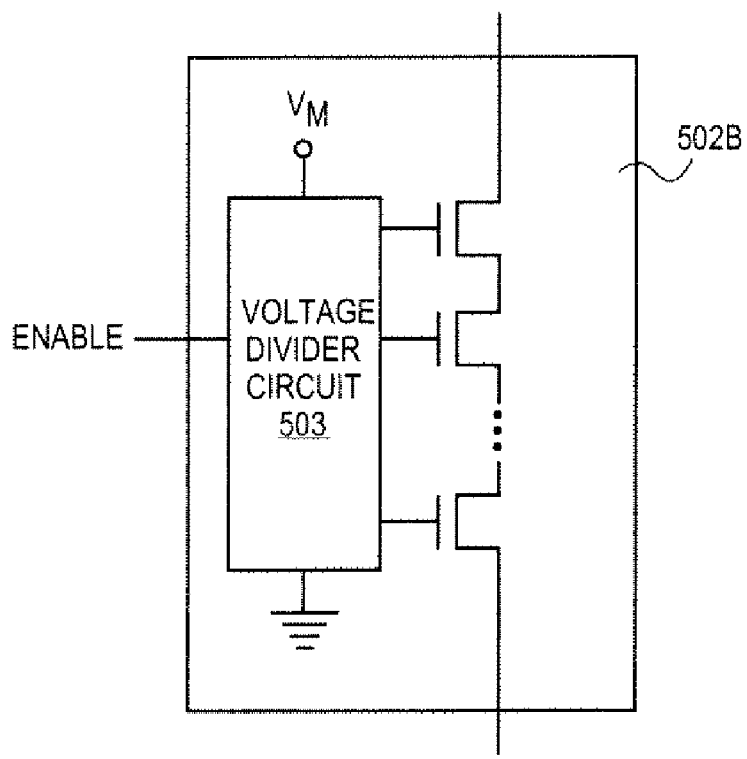
FIG. 5b shows a high voltage protection circuit constructed with cascaded transistors.

FIGS. 5a and 5b show two different embodiments for the high voltage protection circuitry. FIG. 5a shows that a vertical double diffused MOS (vertical DMOS) transistor 502a can be used to implement the high voltage protection circuitry. A vertical DMOS transistor can be suitably tailored to not only receive the full $V_{PROG}$ voltage without itself being damaged, but also can sustain a large voltage drop across its drain and source regions so as to protect the downstream circuitry.

FIG. 5b shows a cascoded arrangement of transistors 502b, where the conductive channel of each transistor is part of the same conductive channel. Each transistor absorbs a different piece of the total voltage drop across the end-to-end conductive channel of the protection circuit 502b. The voltage drop piece that any transistor is designed to support is less than or equal to the maximum voltage drop across the drain and source region that the transistor can handle. As such, none of the transistors are damaged by the application of the $V_{PROG}$ voltage to the capacitive structure.

A voltage divider circuit 503 is used to divide a voltage $V_M$ into discrete voltages that are appropriate gate voltages for each of the transistors in the cascode arrangement. Here, the appropriate gate voltage for each transistor helps in the formation of $V_{GS}$ and $V_{GD}$ voltages for the transistor that supports the range of current flow that could flow through the cascode arrangement and is within the maximum allowed $V_{GS}$ and $V_{GD}$ values specified for the transistor.

$V_M$ can be any voltage sufficient to set-up the gate voltages as described just above. It is expected that, at least for writes, the $V_M$ voltage will be larger than the standard supply voltage typically used for transistors of the type the cascode structure is constructed from (e.g., as found elsewhere in the integrated circuit such as the current sense circuit). In one embodiment $V_M = V_{PROG}$. In another embodiment $V_M = V_{PROG}$ for writes but $V_M$ is something less than $V_{PROG}$ for reads (e.g., the supply voltage used for the current sense circuit). Various circuitry approaches may be used to implement the voltage divider circuit 503 such as a network of passive elements (e.g., a resistor network, a resistor-diode network, etc.).

The protection circuits 302, 502 of FIGS. 3 and 5 show an "enable" signal input that is used to establish a conductive channel between the capacitor structure and the circuitry being protected. When the enable signal is not asserted, the conductive channel is not present (e.g., by turning off the transistor(s) from which the conductive channel is comprised). In one embodiment, the enable signal itself has two states: write and read (or, the protection circuitry may be placed in either of the read or writes states when the enable signal is asserted). In the write state, the protection circuitry is configured to protect against a large voltage that is applied to the capacitive structure. In the read state the protection circuitry is not concerned with protection (e.g., by being configured to handle a small voltage drop compared to the write state) but still provides for a conductive channel.

Figure 6:
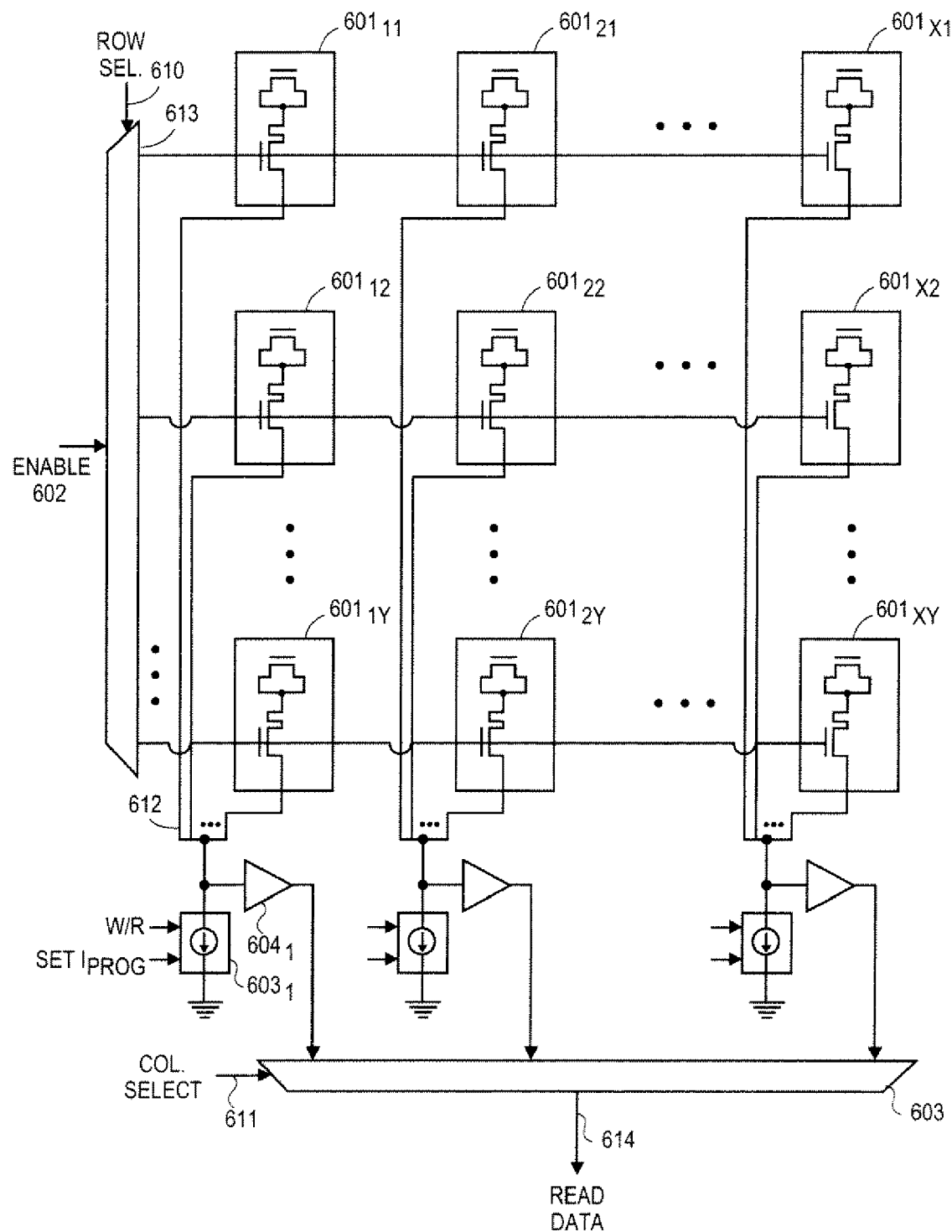
FIG. 6 shows a memory array that stores information with gate dielectrics that have experienced dielectric breakdown.

FIG. 6 shows a memory array built with cells 601 where each cell stores data using a dielectric breakdown technique. According to the design of FIG. 6, cells are arranged into Y rows and X columns. Each column has its own dedicated current source for writing information into a cell (e.g., current source $603_1$ for column x=1) and current sense circuit for reading data from a cell (e.g., current sense circuit $604_1$ for column x=1).

The row select input 610 causes each cell along a particular row to receive an enable signal 602 at its protection circuitry. In an embodiment, assertion of the enable signal not only acts as an access voltage to all the cells in the particular row but also causes the protection circuitry to protect downstream circuitry in the case of a write and at least permit the DC current of the cell's capacitor structure to flow toward its corresponding column's current sense circuitry in the case of a read.

For example, in the case if the first cell from the first row $601_{11}$ is to be selected, the value of the row select input 610 causes an enable signal to flow through the "first" channel of row select multiplexer 613 so as to be received by the protection circuitry for each of the cells along the first row $601_{11}, 601_{21}, \ldots 601_{X1}$.

In the case of a write, the cells of the first row each receive a voltage sufficient to cause their protection circuits to enter a state that protects their downstream circuitry. Moreover, again in the case if the first cell from the first row $601_{11}$ is selected, cell $601_{11}$ is given a voltage $V_{PROG}$ that is sufficiently high to cause dielectric breakdown of the capacitor structure within cell $601_{11}$; and, current source $603_1$, is set to pull the appropriate current $I_{PROG}$ that sets the data value stored in the cell's capacitor structure.

In the case of a read, the cells of the first row each receive a voltage sufficient to cause their protection circuits to enter a state that at least permits the DC current of their corresponding capacitor structure to flow toward their corresponding column's current sense circuitry. Moreover, again in the case if the first cell from the first row $601_{11}$ is selected, cell $601_{11}$ is given a read voltage $V_{READ}$ that causes an amount of DC current that corresponds to the data stored with cell $601_{11}$ to flow out of the capacitor structure of cell $601_{11}$; which, in turn, is sensed by current sense circuit $604_1$. For a read, the column select input 611 is used to present the interpreted data from sense circuit $604_1$ at array output 614.

Of course in an alternative embodiment, current source and sense circuitry could be allocated to each row rather than each column; and, the protection circuitry of each cell in a column could be enabled rather than each cell in a row.

Generally, the $V_{PROG}$ and $V_{READ}$ can be applied by circuitry configured to handle at least their respective voltages. In one embodiment, the respective voltages (or at least $V_{PROG}$) is supplied by way of a DC-DC converter. In a further embodiment the DC-DC converter is an on-chip DC-DC converter. Also, in other or related embodiments the capacitor structure used for storing information may be formed with the "triple gate" structure of a "triple gate" transistor.

Figure 7:
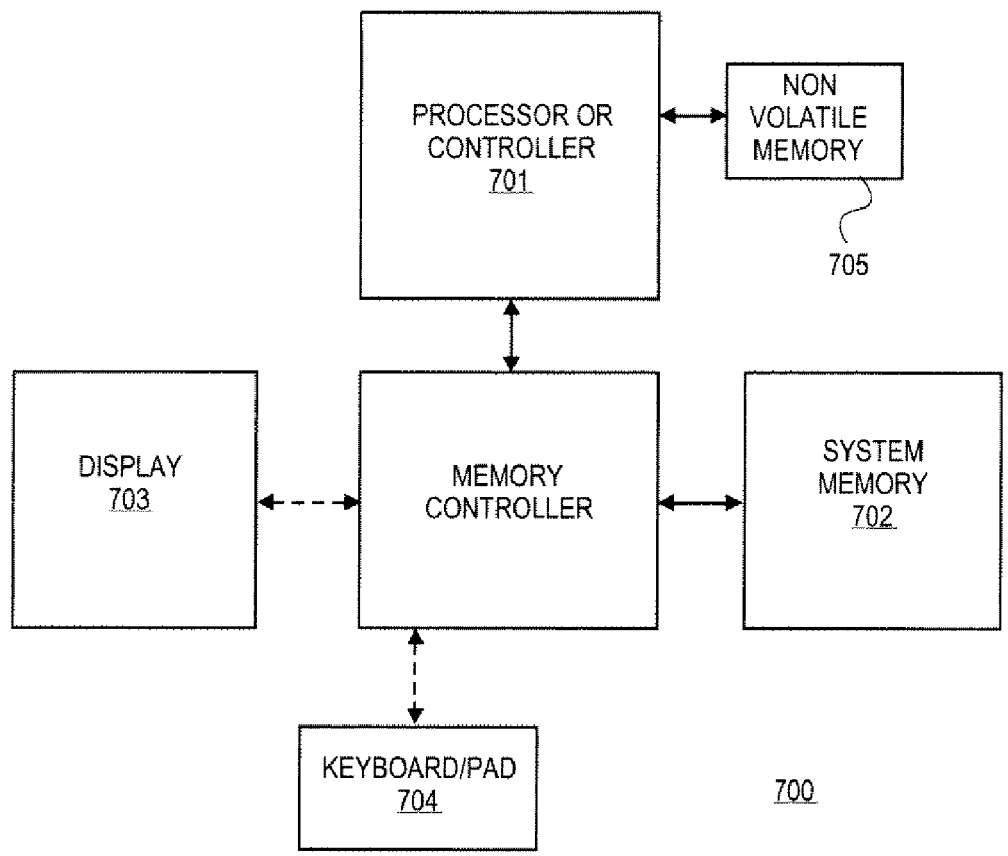
FIG. 7 shows a computing system

FIG. 7 shows a computing system 700 adapted to use a non volatile memory 705 that achieves non volatile storage characteristics by way of dielectric breakdown of its constituent capacitors. The computing system includes a processor or controller 701, "system memory" 702, a display 703 (e.g., liquid crystal display (LCD), thin-film-transistor display (TFT), cathode ray tube (CRT)) and a keypad or keyboard 704. Other components of the computing, such as its I/O, are not drawn for illustrative ease.

The computing system embodiment of FIG. 7 may use the non volatile memory 705 to store various information such as the computing system's BIOS firmware. The computing system of FIG. 7 should be adaptable to many different forms of computing systems such as personal computers, servers and handheld devices (e.g., PDAs, cellphones, etc.).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. An apparatus, comprising:
  a) a capacitor comprising dielectric material, said capacitor being one capacitor amongst an array of capacitors architecturally arranged into rows and columns;
  b) circuitry to provide a first voltage to said capacitor, said first voltage being large enough to cause said dielectric material to suffer dielectric breakdown;
  c) a current source to drive current through said capacitor during said dielectric breakdown to write data into said capacitor;
  d) a circuit to read said data when said circuitry provides a second voltage to said capacitor after said dielectric breakdown, said second voltage inducing a smaller voltage drop across said capacitor than a voltage drop across said capacitor induced by said first voltage;
  e) a node, said node coupled between: i) said capacitor, and, ii) said current source and said circuit;
  f) protection circuitry coupled between said node and said capacitor, said protection circuitry to protect said circuit and said current source from a maximum permissible source-drain voltage induced by said circuitry when it provides said first voltage, said protection circuitry also having an enable input to control whether said protection circuitry permits an electrically conductive path between said node and said capacitor;

g) row select logic circuitry coupled to said enable input, said row select logic circuitry to establish, through said enable input, an electrically conductive path between said node and said capacitor when one of said capacitor's row or column within said array is selected.

2. The apparatus of claim 1 wherein said maximum permissible voltage is said first voltage.

3. The apparatus of claim 1 wherein said circuit is a current sense current to sense current that flows through said capacitor in response to said providing said second voltage to said capacitor after said dielectric breakdown.

4. The apparatus of claim 1 wherein said protection circuitry is constructed with a vertical DMOS transistor.

5. The apparatus of claim 1 wherein said protection circuitry is constructed with a plurality of transistors whose conductive channels are in series.

6. The apparatus of claim 5 wherein said protection circuitry includes a voltage divider circuit having multiple outputs, each of said outputs coupled to its own respective gate node of said plurality of transistors.

7. A method, comprising:
a) applying a first voltage to a capacitor to induce dielectric breakdown within said capacitor, applying a signal to a current source to cause said current source to drive a current through said capacitor during said dielectric breakdown to write data into said capacitor, enabling protection circuitry located between said capacitor and said current source to permit a conductive channel between said capacitor and said current source while protecting said current source from a maximum permissible source-drain voltage that results from said applying, said enabling in response to one of a row or column being selected in an array of capacitors that includes said capacitor;
b) while said protection circuitry is enabled because said one of a row or column is selected, applying a second voltage to said capacitor, placing said current source into a high impedance state and reading said data by sensing current that flows through said capacitor and said protection circuitry, said second voltage inducing a lower electric field intensity through said capacitor than an electric field intensity induced through said capacitor by said first voltage.

8. The method of claim 7 further comprising:
during b) above, maintaining disablement of second protection circuitry located between a second capacitor in said array that is storing second data and a second current source designed to drive current through said second capacitor, said maintaining in response to said one of a row or column being selected, said second capacitor not being coupled to said capacitor's said one of a row or column.

9. The method of claim 8 wherein said data includes more than one bit's worth of information.

10. The method of claim 7 wherein said data includes more than one bit's worth of information.

11. The method of claim 7 further comprising applying a write signal to said current source during a) and applying a read signal to said current source during b).

12. The method of claim 7 wherein said maximum permissible voltage is said first voltage.

13. A computing system, comprising:
i) a memory circuit that includes:
a) a capacitor comprising dielectric material, said capacitor being one capacitor amongst an array of capacitors architecturally arranged into rows and columns;
b) circuitry to provide a first voltage to said capacitor, said first voltage being large enough to cause said dielectric material to suffer dielectric breakdown;
c) a current source to drive current through said capacitor during said dielectric breakdown to write data into said capacitor;
d) a circuit to read said data when said circuitry provides a second voltage to said capacitor after said dielectric breakdown, said second voltage inducing a smaller voltage drop across said capacitor than a voltage drop across said capacitor induced by said first voltage;
e) a node, said node coupled between: i) said capacitor, and, ii) said current source and said circuit;
f) protection circuitry coupled between said node and said capacitor, said protection circuitry to protect said circuit and said current source from a maximum permissible source-drain voltage induced by said circuitry when it provides said first voltage, said protection circuitry also having an enable input to control whether said protection circuitry permits an electrically conductive path between said node and said capacitor;
g) row select logic circuitry coupled to said enable input, said row select logic circuitry to establish, through said enable input, an electrically conductive path between said node and said capacitor when one of said capacitor's row or column within said array is selected;
ii) a processor or controller to process said data, said processor or controller coupled to said memory;
iii) a display coupled to said processor or controller through a memory controller, said display being a liquid crystal display (LCD).

14. The computing system of claim 13 wherein said maximum permissible voltage is said first voltage.

15. The computing system of claim 13 wherein said circuit is a current sense current to sense current that flows through said capacitor in response to said providing said second voltage to said capacitor after said dielectric breakdown.

16. The computing system of claim 13 wherein said protection circuitry is constructed with a vertical DMOS transistor.

17. The computing system of claim 13 wherein said protection circuitry is constructed with a plurality of transistors whose conductive channels are in series.

18. The computing system of claim 17 wherein said protection circuitry includes a voltage divider circuit having multiple outputs, each of said outputs coupled to its own respective gate node of said plurality of transistors.

* * * * *